United States Patent [19]

Kawakatsu et al.

[11] Patent Number: 4,721,877
[45] Date of Patent: Jan. 26, 1988

[54] LIGHT DIFFUSIVE COATING AND A LAMP HAVING THE COATING

[75] Inventors: Akira Kawakatsu, Yokohama; Toshio Karino, Zushi; Yooji Yuge, Chigasaki, all of Japan

[73] Assignee: Kabushiki Kaisha Toshiba, Kawasaki, Japan

[21] Appl. No.: 778,001

[22] Filed: Sep. 20, 1985

[30] Foreign Application Priority Data

Sep. 28, 1984 [JP] Japan ................................. 59-203672
Sep. 28, 1984 [JP] Japan ................................. 59-203673

[51] Int. Cl.$^4$ ......................... H01K 1/26; H01K 1/50; H01K 1/32
[52] U.S. Cl. .................................. 313/111; 313/112; 313/116; 313/579; 313/580
[58] Field of Search ............... 313/116, 117, 112, 580, 313/579, 111

[56] References Cited

U.S. PATENT DOCUMENTS

| | | | |
|---|---|---|---|
| 2,811,131 | 10/1957 | Lopenski et al. | |
| 2,946,911 | 7/1960 | Malinowski | 313/116 |
| 3,209,188 | 9/1965 | Freeman | 313/580 X |
| 4,459,506 | 7/1984 | Beck | 313/578 X |
| 4,588,923 | 5/1986 | Hoegler et al. | 313/580 X |

FOREIGN PATENT DOCUMENTS

WO79/00424 7/1979 PCT Int'l Appl.
473738 7/1969 Switzerland.
599334 3/1948 United Kingdom.

OTHER PUBLICATIONS

"Oxide Layers Deposited from Organic Solutions", by H. Schroeder, Phys., of Thin Film, (1969), pp. 87-141.

*Primary Examiner*—Palmer C. DeMeo
*Attorney, Agent, or Firm*—Oblon, Fisher, Spivak, McClelland & Maier

[57] ABSTRACT

A light diffusive coating having an excellent light diffusion effect, a method of forming the coating and a halogen lamp with the coating. The light diffusive coating includes bubbles within a continuous coating consisting of a metal oxide formed on a base. The method of forming the light diffusive coating is made by the inclusion of bubbles formed by the evaporization of a high boiling-point organic solvent within the metal oxide coating formed by the application of a combination of an organo-metallic compound with a high boiling-point organic solvent to a base surface, and the subsequent decomposition of the organo-metallic compound on baking. The halogen lamp has a porous light diffusive coating formed on the coating established on the surface of the outer vessel which allows visible light to pass through but reflects infra-red light, so that strain, caused by the difference in thermal expansion efficient of the structural material of the outer vessel and the structural material of the light diffusive layer occuring when the outer vessel is at a high temperature, is absorbed by the porous structure, and prevents peeling.

4 Claims, 6 Drawing Figures

LIGHT DIFFUSIVE COATING AND A LAMP HAVING THE COATING

BACKGROUND OF THE INVENTION

1. Field of the Invention

This invention relates to a light diffusive coating which is formed on a base surface of lamps such as halogen lamps, high pressure discharge lamp bulbs, optical filters, window glass, etc., giving a diffusive characteristic, and to a method of forming usch a coating, and which makes possible lamps which are more efficient and give uniform illumination.

2. Description of the Prior Art

In order to give uniform distribution of illumination over the illuminated surface, halogen lamps for photocopiers, for example, have several filaments connected in series through conductors, and the whole assembly is enclosed in a straight tube type vessel made of silica glass so that it lies along the axis of the tube. However, because this halogen lamp includes a large amount of infra-red radiation in its emissions, there is a danger that the item being photocopied will be damaged by the heat. For this reason, the lamp surface generally undergoes a honing treatment to provide a diffusive surface. This method, however, has the disadvantage of being very laborious. In addition, the methods of forming a light diffusive coating by applying a fine diffusive powder such as silica to the outside of the lamp by electrostatic coating and etching may be considered. These types of coating are generally weak for mechanical stresses, wear easily, and in some cases the light diffusive effect falls off with a long period of use. Dependent on the type of fine light diffusive powder, there are cases where the coating has a poor affinity for the quartz glass, and readily peels off.

With regard to these points, the applicants have previously developed the technology of forming a coating on the surface of the transparent outer vessel which allows visible light to pass through, but reflects infra-red light, and by providing a light diffusive coating on top of the infra-red reflective coating, the visible light which has passed through the infra-red reflective coating is dispersed by the light diffusive coating, giving a uniform distribution of illumination on the illuminated surface. This was proposed in the Japanese Patent Application Number Sho 58-95001/1983). However, when this technology is applied to lamps, such as halogen lamps for example, because the temperature of the lamp's surface is extremely high, with some light diffusive coatings, there is the danger that the light diffusive coating may peel off due to the effect of repeated switching on and off over a long period. This means that it is essential to select a light diffusive coating which is stable regardless of the rise and fall in temperature and which is mechanically strong.

SUMMARY OF THE INVENTION

An object of the present invention is to provide a light diffusive coating and a method of manufacturing thereof which can be readily applied to large-scale production, is mechanically robust and resistant to wear, can be applied without problem to the inside or outside of the base surface of lamps, etc., regardless of their material, and which provides excellent diffusion.

Another object of the invention, moreover, does not damage the effect of Application Number Showa 58-95001 by adding to the limits required by the light diffusive coating proposed in the application, but aims to produce a lamp with no danger of the diffusive coating peeling off, even with repeated switching on and off over a long period.

Further object of the present invention is to provide a lamp having the light diffusive coating.

Additional objects, advantages, and features of the present invention will become apparent to persons skilled in the art from a study of the following description and of the accompanying drawings, in which:

DESCRIPTION OF THE PREFERRED EMBODIMENTS

Figure 1:
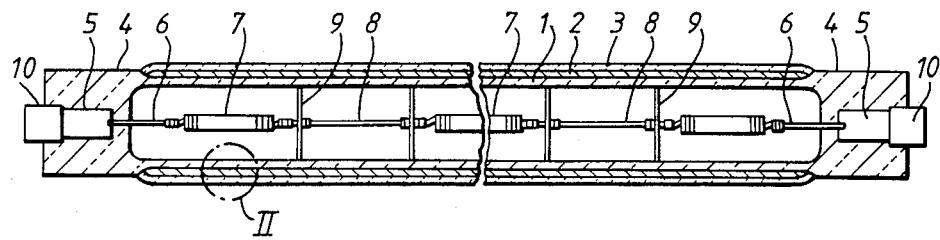
FIG. 1 shows a section of a halogen lamp which is one embodiment of the present invention.

The first part of the present invention is a light diffusive coating which provides light diffusion by the inclusion of bubbles within the continuous coating which is formed on a base.

The second part of the present invention is a method of forming the light diffusive coating by the inclusion of bubbles formed by the vaporization of a high boiling-point organic solvent within the metal oxide coating formed by the application of a combination of an organo-metallic compound with a high boiling-point organic solvent to a base surface, and the subsequent decomposition of the organo-metallic compound on baking.

The third part of the present invention is a halogen lamp which has a porous light diffusive coating formed on the coating established on the outer surface of the outer vessel which allows visible light to pass through but reflects infra-red light, so that strain, caused by the difference in thermal expansion efficient of the structural material of the vessel and the structural material of the light diffusive layer occurring when the vessel is at a high temperature, is absorbed by the porous structure, and prevents peeling.

The details of the present invention are described with reference to the embodiment in the drawings, namely, FIGS. 1 to 6. Throughout the drawings, like reference numerals and letters are used to designate like or equivalent elements for the sake of simplicity of explanation.

Referring now to FIG. 1, there is shown a halogen lamp for a photocopier as an example of a lamp according to the third part of the present invention. This halogen lamp has had a coating 2 which allows visible light to pass through but reflects infra-red light, formed on the outside surface of a straight tube type vessel 1 made from a transparent, heat-resistant glass such as quartz glass. A porous light diffusive coating 3 has been formed on top of the reflective coating 2. Pressure sealed seal sections 4, 4 have been constructed at each end of the vessel 1, and molybdenum foil conductors 5, 5 have been embedded into each of these seal sections 4, 4. One end of each of these pieces of molybdenum foil 5, 5 is in contact with internal conductors 6, 6 which are stretched inside the vessel 1. Between these internal conductors 6, 6, several filaments 7, 7 . . . are connected serially in position along what is virtually the centre line, via non light-emitting sections formed by low resistance conductors 8, 8 . . . . The serially connected filaments 7, 7 . . . and low resistance conductors 8, 8 . . . are held in position on the centre line of the vessel 1 by means of anchors 9, 9 . . . . The other ends of the foil conductors 5, 5 are connected to the caps 10, 10 attached to each end of the vessel 1 through external conductors which are not shown in the drawing. The required halogen is sealed inside the vessel 1 along with an inert gas such as argon.

Figure 2:
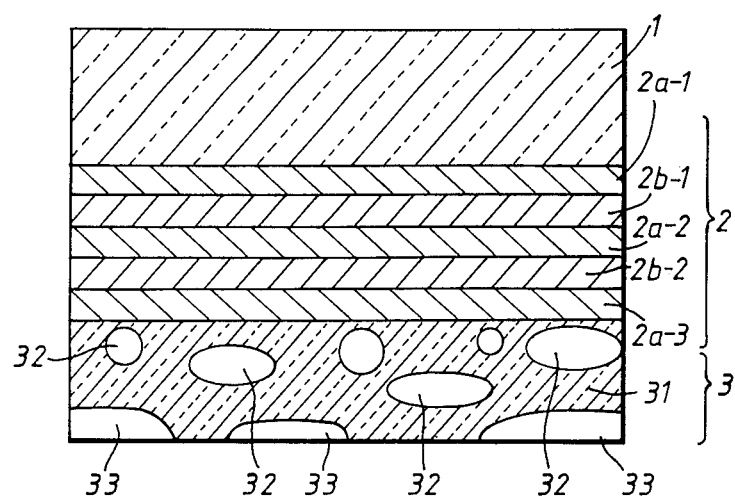
FIG. 2 shows an enlarged schematic section of section II marked on FIG. 1.

Referring now to FIG. 2, which is an enlargement of section II in FIG. 1, there is shown in detail the infrared reflecting coating 2 described above typically has a multilayered coating, consisting of alternate high refractive index layers 2a (left-slanting hatching) made from titanium oxide; $TiO_2$ etc., and low refractive index layers 2b (right-slanting hatching), made from silica; $SiO_2$, etc. Due to the effect of optical interference, this allows visible light to pass through readily, but reflects infra-red light very well. The layers 2a, 2b are exaggerated in the drawing; an appropriate thickness is 0.2–0.3 $\mu$m (micron meter).

Various types of the light diffusive coating 3 described above may be considered, but the drawings show a typical example. As is made clear by FIG. 2, and by the electron micrograph in FIG. 3, the light diffusive coating 3 has numerous bubbles 32, 32 . . . inside the continuous coating material 31, made from metal oxide, and numerous circular pits 33, 33 . . . which are a variety of these bubbles, are formed on the surface of the coating 31. The transmitted light is dispersed by these bubbles 32 and pits 33, and the light diffusive layer 3 appears cloudy to the naked eye. The light diffusive layer 3 is formed with a thickness of 3000–8000 A (angstrom), or 0.3–0.8 $\mu$m. Examples of suitable metal oxides are titanium oxide; $TiO_2$, silica; $SiO_2$, alumina; $Al_2O_3$, zirconia; $ZrO_2$, zinc oxide; $ZnO$, tantalum oxide; $Ta_2O_5$, tin oxide; $SnO_2$ and indium oxide; $In_2O_3$.

Even though the filaments 7, 7 of the halogen lamp are arranged with spaces between them, because their light is emitted after dispersion by the light diffusive layer 3, there is no irregular illumination of the illuminated surface. Moreover, even though there is a large difference between the thermal expansion coefficients of the titanium oxide which makes up the light diffusive coating 3 and the reflective coating 2 and quartz glass forming the vessel 1, because the reflective coating 2 and the light diffusive coating 3 are together extremely thin, and the upper light diffusive coating 3 has the bubbles 32 and the pits 33 within its material 31, mechanical strain caused by the difference in thermal expansion coefficients is alleviated, and the light diffusive coating 3 does not peel off even with repeated switching on and off over a long period. Furthermore, because the light diffusive coating 3 is extremely thin, the level of light loss, at no more than 3–4%, is excellent. In addition, because the light diffusive coating 3 material is continuous, it is mechanically strong, there is no danger of wear, and there are no changes in the light diffusive characteristics over a long period of use.

The manufacturing method for this halogen lamp will be outlined. Firstly, a straight tube type halogen lamp with the filaments 7, 7 . . . sealed inside is manufactured by normal methods. A titanium solution is then prepared by dissolving an organic titanium oxide, with tetraisopropyl titanate as the main constituent, in an organic solvent with acetic ester as the main constituent. This solution has 2–10% titanium by weight, and its viscosity is adjusted to approximately 1.0 cps. The sealed halogen lamp described above then has its first high refractive index layer 2a-1, consisting of titanium oxide, formed on the outer surface of the vessel 1 by dipping it into this titanium solution, withdrawing it at a speed of approximately 30 cm/minute, drying and baking it.

A silica solution is also prepared by dissolving an organic silicon oxide, with ethyl silicate as its main constituent, in an organic solvent with ethyl ester as the main constituent. This solution has 2–10% silicon by weight, and its viscosity is adjusted to approximately 1.0 cps. The halogen lamp with the first high refractive index layer 2a-1 described above then has its first low refractive index layer 2b-1, consisting of silica, formed by dipping it into this silica solution, withdrawing it at a speed of approximately 35 cm/minute, drying and baking it. Further high refractive index layers 2a-2 . . . and low refractive index layers 2b-2 . . . are formed alternately in the same way up to a total of about 10 layers, completing the construction of the infra-red reflective coating.

Figure 4:
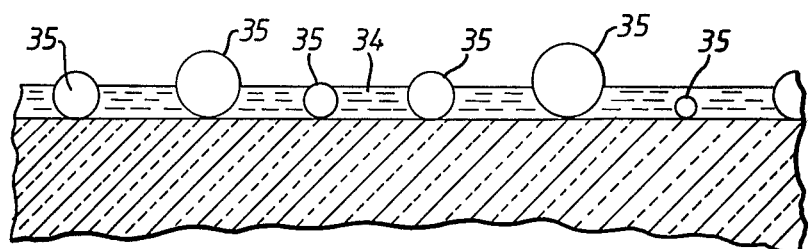
FIG. 4 shows a schematic section of the coating before baking in the method of forming the light diffusive coating.

5–10% of a high boiling-point organic solvent such as di-2-ethylhexyl phthalate or di-octyl phthalate (abbreviated to DOP, hereinafter) is then added to the solution of an organic titanium compound in a low boiling-point organic solvent in the example described above, and a low boiling point organic solvent is added to this to bring the density down to a suitable level. The halogen lamp with the infra-red coating 2 described above is then dipped in this solution, withdrawn at a speed of 30–50 cm/minute and dried. DOP described above is a colourless oily liquid which boils at 231° C. and 5 mm Hg, and mutually dissolves with the low boiling-point organic solvent to a certain extent. In the drying process, only the low boiling-point organic solvent evaporates. After drying, as can be seen in FIG. 4, the gel-state coating 34 is clouded with dispersed microscopic droplets of DOP.

Figure 3:
FIG. 3 shows an electron micrograph of the outer surface of the light diffusive coating 3 part of FIG. 2.

The halogen lamp with the gel-state coating 34 is baked in air for approximately 5 minutes at approximately 600 C. When this is done, the evaporation of the droplets of DOP dispersed throughout the gel-state coating 34 and the decomposition of the organic titanium compound occur more or less simultaneously. Because of this, the droplets of DOP evaporize in almost the same position, expand and become bubbles 32. DOP vapour in these bubbles 32 is gradually substituted by air. The droplets of DOP near to the surface of the gel-state coating 34 burst due to their expansion, link up with the outside air and become the pits 33. Finally a light diffusive layer 3 containing bubbles 32 and pits 33 within a continuous titanium oxide coating is formed, as shown in FIG. 3. As is clear from this formation process, the bubbles 32 and pits 33 in the present invention are basically the same thing. In this way, in addition to appearing to improve the formation of the organic titanium compound coating, DOP forms droplets within the gel-state coating 34 which grow into bubbles 32. Because of this, the bubbling is effective even though the gel-state coating 34 is extremely thin. Also, DOP has a high boiling point, close to the decomposition temperature of the organic titanium compound, so that even when heat decomposition of the organic titanium compound begins, sufficient vapour pressure is maintained within the bubbles 32. This prevents the bubbles 32 from being crushed or the pits 33 being levelled out before the decomposition and solidification of the organic titanium compound. Accordingly, the coating 34 hardens with the bubbles 32 and pits 33 still included and in good shape. If too little DOP is added, the bubbles 32 and pits 33 are too small, and the light diffusive effect is reduced. Conversely, if too much DOP is added, large irregularities in the sizes of the bubbles 32 and pits 33, local irregularities in diffusion, and large pits visible to the naked eye may be formed.

If the coating 34 is made thicker by adjusting the viscosity of the coating material, large bubbles and pits are produced, but on the other hand, the pits 33 become shallower, and light dispersion deteriorates. In contrast to this, if the coating 34 is made thinner, then since the bubbles 32 and pits 33 remain small, it is possible to form a coating with several layers of this thin light diffusive coating. According to experimentation, when a light diffusive coating 3 with a thickness of 0.5–1 $\mu$m formed by several layers of thin light diffusive coating 31 was observed with an electron microscope, it was found to have 20,000–60,000 bubbles 32 and pits 33 per 1 $mm^2$, and despite its thinness, it gave excellent light diffusion, and moreover there were no mechanical or optical problems with the infra-red reflective coating 2.

The high boiling-point organic solvent is not restricted to DOP, but may be any with similar physical properties which does not produce decomposition residues on baking.

Light diffusive coatings were made by the same method as above, by adding varying proportions of various high boiling-point organic solvents to the organic titanium compound. The light diffusion effect of the coatings was investigated, and the results are shown in Table 1 in next page.

TABLE 1

| Solvent | Boiling point | 5% conc. | 10% conc. | 20% conc. |
| --- | --- | --- | --- | --- |
| DBP | 339 C | Good diffusion | Good diffusion | Good diffusion |
| DOP | 231 C (5 mm Hg) | Good diffusion | Good diffusion | Good diffusion |
| DAP | 175 C | Transparent | Weak diffusion | Weak diffusion |

Here, DBP, DOP and DAP are respectively abbreviations for di-butyl phthalate, di-octyl phthalate, and di-allyl phthalate.

From Table 1 it can be seen that when a light diffusive coating 3 is formed using an organic titanium compound, then 5–20% of DBP or DOP should be added. In addition, if low light diffusion is satisfactory, then 10–20% of DAP may also be used.

Light diffusive coatings were made by the same method as above, by adding varying proportions of various high boiling-point organic solvents to the organic silicide. The light diffusion of the coating was investigated, and the results are shown in Table 2.

TABLE 2

| Solvent | 5% conc. | 10% conc. | 20% conc. |
| --- | --- | --- | --- |
| DBP | Good diffusion | Good diffusion | Good diffusion |
| DOP | Good diffusion | Good diffusion | Good diffusion |
| DAP | Transparent | Weak diffusion | Weak diffusion |

From Table 2 it can be seen that when a light diffusive coating is formed using an organic silicide, then 5–20% of DBP or DOP should be added. If formed under the same conditions then the titanium oxide diffusive coating gives better light diffusion than the silica light diffusive coating. This is thought to be due to the difference in their refractive indices.

Figure 5:
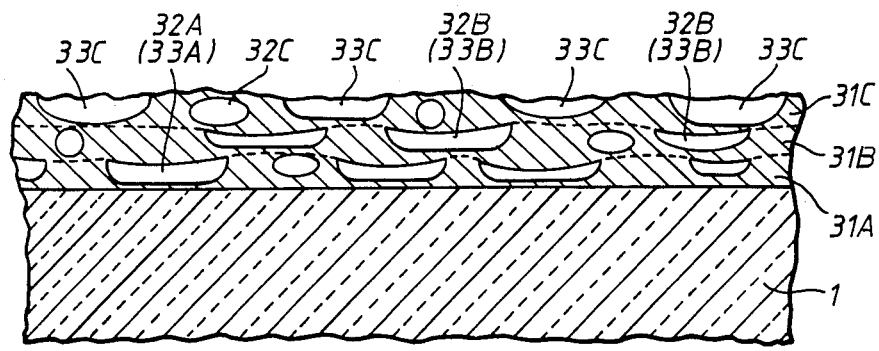
FIG. 5 shows a schematic section of a multi-layered light diffusive coating.

Furthermore, the dispersive effect of the light diffusive coating can be increased by applying several layers of a thin light diffusive coating, about 0.1 um, to the same base. In this case, the first thin light diffusive coating is formed on the base by the method described above, and the second and subsequent thin light diffusive coatings are formed on top. In this case, as shown in FIG. 5, the pits 33A, 33B which are produced when the lower layers 31A, 31B are formed are covered up by the upper layers, but the bubbles 32A, 32B remain as they are. The result of this is as if it was a thick light diffusive coating with an extremely large number of bubbles, providing excellent diffusion.

When the light diffusive coating is formed in several layers, the method used may be that of application and baking repeated for each layer, or that of applying several layers and baking afterwards.

The light diffusion effect may be further improved by the production of 0.001–10 um microcrystals by baking the continuous coating 31 in air at 1,000 C. for 10 minutes after the baking and hardening process described in the embodiment above. If this is done, the titanium layers in the previously formed infra-red reflective coating also crystalize, but this is acceptable.

In addition, light diffusive coatings of different metal oxides may be formed by using organic compounds of other metals in the same way as in the method described above. The light diffusion effect of the light diffusive coating 3 may also be strengthened by combination with the pre-existing technology of dispersing particles of other metal compounds within the light diffusive coating material 31.

Special properties may also be produced by adding metal compounds with special properties to these light diffusive coating materials. For example, by introducing powders with good thermal conductivity such as metal powders and aluminium oxide powder, the thermal radiation is increased. Also, if colouring powders such as cobalt blue are introduced, a coloured light diffusive coating which colours emitted light is produced. In these cases, the additive may or may not have a lighter diffusive effect, but if such an effect is required, the particle size of the additive should probably be 0.001 u or larger.

The operation of the halogen lamp in the embodiment shown in FIG. 1 and FIG. 2 will be explained. When electricity is passed between the caps 10, 10, the filaments 7, 7 . . . emit light. Of the light emitted by the filaments 7, 7 . . . , the infra-red light is reflected by the infra-red reflective coating 2 with most of it returning to the filaments 7, 7 . . . , heating them, and helping to improve their light-emitting efficiency. The visible light which has passed through the infra-red reflective coating 2 is dispersed by the light diffusive coating 3 and emitted as diffused light. Consequently, with this lamp, the distribution of light on the illuminated surface is more uniform, and an optical image of the filaments 7 does not arise, even if it is used in combination with a reflector.

Since there are many bubbles 32 and pits or variant bubbles, 33, in the light diffusive coating 3 of this halogen lamp, if the vessel 1 of the lamp is heated to a high temperature, the strains caused by the difference in thermal expansion coefficients of the outer tube and the titanium oxide of the light diffusive coating are absorbed by the bubbles 32 and pits 33. Because of the light diffusive coating 3 resists to peel off, even with repeated switching on and off over a long period. In addition, the light diffusive coating in this embodiment is extremely thin, 0.5–1 μm, which helps to reduce the strains, and is another reason why peeling does not occur.

Figure 6:
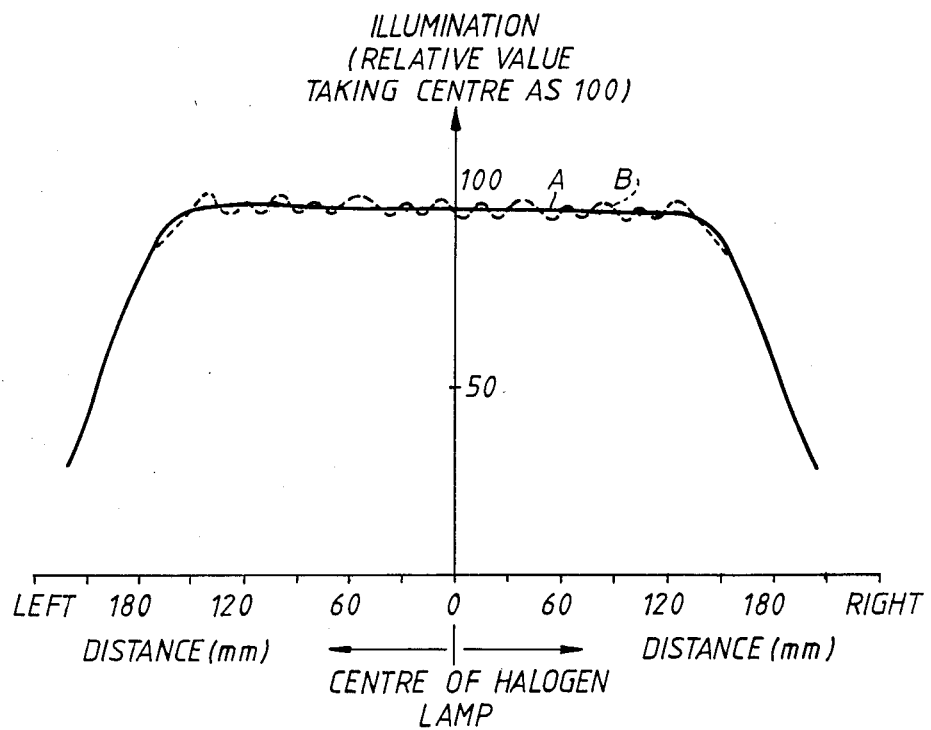
FIG. 6 is a graph showing the effectiveness of the light diffusive coating in this embodiment.

The light distribution along the axis of a photocopier lamp rated at 150 V, 250 W, in the embodiment described above, before and after formation of the light diffusive coating 3 were compared. The results are shown in FIG. 6. In FIG. 6, the X axis takes the centre of the lamp as 0 and measures the distance along the axis in mm. The Y axis gives the relative value of illumination, taking the centre of the straight tube type halogen lamp as 100. Curve A (solid line) shows the light distribution of the lamp after formation of the coating 3, and curve B (dotted line) shows the light distribution of the lamp before formation of the coating 3. From this graph it can be seen that the light distribution has been made uniform by formation of the coating 3.

Also, when the brightness (total luminous intensity) of the lamp before and after coating was compared, it fell by no more than 2–3% with the formation of the coating. This low light loss is a characteristic of this light diffuisive coating 3.

The presents invention can also be applied to halogen lamps, such as those using T-shaped tube type vessels or G-shaped tube type vessels. In a T-shaped type vessel, the filaments should be arranged almost concentrically, and in a G-shaped type vessel they should be arranged close to the centre of the rounded section. In addition, this invention may be used to form layers of coatings which let through visible light but reflect infra-red light and porous light diffusive coatings in the way described above on the outer surface of both blocked and unblocked transparent vessels. Moreover, it is possible to produce normal tube type halogen lamps with neither infra-red reflective coating or light diffusive coating on the centre section.

The present invention is also applicable to halogen lamps for cars by forming layers of infra-red reflective coating and light diffusive coating on the outer surface of a T-shaped tube type glass vessel and placing a single filament in the centre of this vessel.

Since, even if used in combination with a reflector, no optical image of the filament is formed on the illuminated surface, no irregular illumination is produced by the lamp.

The present invention may also be applied to ordinary lamps. The vessel may be either spherical or pear-shaped, and the filament should be placed at the center of the sphere or hemisphere section. In addition the present invention may be applied by forming layers of infra-red reflective coating and light diffusive coating on the outer surface of an unblocked inner tube, which then has a filament placed in its center, and the assembly is then sealed in a cylindrical outer tube. In this case the inner tube touches the outer tube.

In the embodiment described above, a light diffusive coating 3 was formed on the outside surface of an tube, but the invention is not limited to this application. It may also be formed on any surface, such as the inside surface of a halogen lamp, on the inside or outside surfaces of ordinary lamps and infra-red lamps, etc., using soft glass such as soda lime glass or hard glass such as borosilicate glass, on the inside or outside surfaces of the vessel of high pressure discharge lamps, or on plate glass such as optical filters or window glass. Here, the surfaces on which the coating may be formed are given the generic name "base".

Since the light diffusive coating in the present invention produces light diffusion by means of bubbles included in a continuous coating consisting of a metal oxide formed on a base, in spite of being extremely thin, it gives excellent light diffusion, reduces mechanical strain due to differences with the thermal expansion coefficients of the base, and can withstand repeated heating and cooling shocks over a long period, is mechanically robust, there is no reduction in light diffusion even over a long period of use, and light loss is extremely small.

The method of forming the light diffusive coating in the present invention is by applying an organo-metallic compound combined with a high boiling-point solvent to a base and baking so that the organo-metallic compound decomposes to form a metallic oxide coating. Because of this, after application, the high boiling-point organic solvent forms tiny droplets which disperse throughout the coating, and then vaporize in the same position to form bubbles. This method allows the very simple formation of a light diffusive coating which is extremely thin and gives excellent light diffusion.

Furthermore, since the present invention involves the establishment of a coating which allows visible light to pass through but reflects infra-red light on the outside surface of the transparent vessel of a halogen lamp, and the establishment of a porous light diffusive coating on top of this reflective coating, there is little infra-red radiation, efficiency is high, the light distribution on the illuminated surface is uniform, and there is no danger of the appearance of an optical image of the filament, even if used in combination with a reflector. Moreover, there is the advantage that there is no danger of the coating peeling off with repeated switching on and off over a long period, even though the vessel may be heated at high temperatures.

What is claimed is:

1. A light diffusive coating comprising a layer of solidified metal oxide containing a plurality of discontinuous air-containing void spaces formed by evaporation at approximately 600° C. of occluded solvent droplets with said layer, such that said void spaces are sufficient in number and size to enhance light diffusion by said coating.

2. A light diffusive coating according to claim 1, wherein some of said void spaces are opened at the surface of said coating.

3. A lamp comprising:
   a transparent glass vessel with an internal and an external surface;
   a light diffusive coating formed on said external surface of said glass vessel, wherein said light diffusive coating contains a plurality of discontinuous air-containing void spaces, formed by the evaporation at approximately 600° C. of occluded solvent droplets within said layer, such that said void spaces are sufficient in number and size to enhance light diffusion by said coating; and a filament sealed inside said glass vessel.

4. A halogen lamp comprising:

a transparent glass vessel with an internal and an external surface;

a coating which allows visible light to pass through but reflects infra-red light, formed on said external surface of said glass vessel;

a light diffusive coating applied onto said infra-red light reflective coating, wherein said light diffusive coating contains a plurality of discontinuous air-containing void spaces, formed by the evaporation at approximately 600° C. of occluded solvent droplets within said layer, such that said void spaces are sufficient in number and size to enhance light diffusion by said coating; and a filament situated within the central section of said glass vessel.

* * * * *